United States Patent [19]

Luryi et al.

[11] Patent Number: 4,999,687
[45] Date of Patent: Mar. 12, 1991

[54] LOGIC ELEMENT AND ARTICLE COMPRISING THE ELEMENT

[75] Inventors: Sergey Luryi, Bridgewater; Mark R. Pinto, Morristown, both of N.J.

[73] Assignee: AT&T Bell Laboratories, Murray Hill, N.J.

[21] Appl. No.: 514,078

[22] Filed: Apr. 25, 1990

[51] Int. Cl.$^5$ .................................. H01L 29/161
[52] U.S. Cl. ................................. 357/16; 357/36; 307/445; 307/450; 307/448; 307/446
[58] Field of Search ....................... 357/16, 36, 92; 307/445, 450, 448, 446

[56] References Cited

U.S. PATENT DOCUMENTS

| | | | |
|---|---|---|---|
| 4,286,177 | 8/1981 | Hart et al. | 357/36 X |
| 4,712,022 | 12/1987 | Vu | 307/450 |
| 4,853,753 | 8/1989 | Capasso et al. | 357/16 X |
| 4,857,771 | 8/1989 | Ovens et al. | 307/446 X |
| 4,896,057 | 1/1990 | Yang et al. | 307/448 |

OTHER PUBLICATIONS

"Heterojunction Band Discontinuities: Physics and Device Applications", F. Capasso et al., editors, Elsevier 1987, pp. 513–537.

Primary Examiner—William Mintel
Attorney, Agent, or Firm—E. E. Pacher

[57] ABSTRACT

Disclosed are a novel logic element (designated NORAND), and articles that comprise the element. Exemplarily, the NORAND element comprises three input terminals and an output terminal. If one of the input terminals is at logic 0 then the element functions as a logic NOR unit, and if the terminal is at logic 1 the element functions as a logic AND unit. The novel element thus makes possible reprogrammable and/or self-organizing logic circuits. The NORAND element can be realized with a single active semiconductor device, exemplarily a real space transfer (RST) device.

10 Claims, 5 Drawing Sheets

$f(x_1 \cdot x_2 \cdot ... x_n)$

LOGIC ELEMENT AND ARTICLE COMPRISING THE ELEMENT

FIELD OF THE INVENTION

This invention pertains to devices (typically semiconductor devices) that can be used to perform logic operations, and to articles comprising such a device. In a particular embodiment the devices are real space transfer semiconductor devices.

BACKGROUND OF THE INVENTION

Real space transfer (RST) devices are known to the art. See, for instances, "Heterojunction Band Discontinuities: Physics and Device Applications", F. Capasso et al., editors, Elsevier 1987, especially pages 513-537, incorporated herein by reference.

Known RST devices are a transistor variously called charge-injection transistor (CHNIT) or negative resistance field effect transistor (NERFET), and the hot-electron erasable programmable random access memory (HE²PRAM). See, for instances, U.S. Pat. No. 4,903,092, also incorporated herein by reference.

Briefly, the transistor is a three-terminal device based on real-space transfer of hot electrons from a first to a second conducting region. The two conducting regions are separated by a barrier region and are contacted independently, with one of the conducting regions (referred to as the "channel") having two surface contacts (frequently referred to as "source" and "drain"). Application of a source-to-drain bias $V_{sd}$ leads to a heating of channel electrons and consequent charge injection into the second conducting layer. The channel thus acts as a hot electron emitter and the second conducting layer as a collector. This terminology will be used herein. The above discussed transistor shows a strong negative differential resistance in the source-drain characteristic (the NERFET action) and an efficient control of the injection current ($I_c$) by the source-drain voltage (CHINT action).

HE²PRAM comprises, in addition to the above described elements, a "deep" drain that contacts both the emitter and the collector.

A logic circuit that comprises prior art RST devices is also known. For instance, on page 520 of the above referenced monograph is disclosed a logic circuit comprising two NERFETs.

Those skilled in the art are well aware of the desirability of having available devices that have novel operating characteristics, since such devices may make possible attainment of previously unachievable results, or may result in more economical attainment of some desired results. For instance, prior art implementation of basic logic functions (e.g., AND, NOR) generally requires a multiplicity of active elements (typically transistors). It would clearly be desirable, both from an economic and from a performance point of view, to be able to implement such logic functions with logic elements that comprise only a single active device, and thus reducing the device count and the number of gate delays. As a second example, it would be highly desirable to have available a device that can carry out a logic function which in the prior art required two or more separate logic elements. As a third example, it would be very desirable to have available a device that can carry out either a first or a second logic functions. This application discloses a novel device that has these and other advantageous attributes. It also discloses articles that utilize the novel device.

DEFINITIONS

A "logic element" herein is a circuit element that has at least two input terminals and an output terminal. The element accepts binary input signals, performs a predetermined transformation on the input signals, and presents the resulting binary output signal at the output terminal. Examples of logic elements are AND, OR, NAND, NOR, and EXCLUSIVE NOR (XNOR) elements.

A "logic function" herein is the transformation provided by a logic element. For instance, a AND logic element provides the AND logic function, i.e., its output depends on the inputs in the manner described by the AND truth table.

By the "electrical state" of a logic element we mean herein the totality of eletrical signals applied to the input terminals. For a logic element with two input terminals (A, B) a particular electrical state thus is $A=1$, $B=0$, and a further particular state is $A=0$, $B=1$, where 1 and 0 are used in conventional fashion.

By the "general" electrical state of a logic element we mean herein the combination of electrical signals applied to the input terminals. By this we mean that, for instance, $A=1$, $B=0$ is the same general electrical state as $A=0$, $B=1$, since the combination in both cases is a logic 0 and a logic 1.

SUMMARY OF THE INVENTION

In broad aspects the invention is an electronic logic element comprising a single active electronic device, and articles comprising the novel logic element, including articles comprising a re-programmable or a self-organizing logic circuit. More particularly, the novel logic element comprises at least three input terminals and performs a transformation that is described by a truth table that could previously not be achieved with a single logic element. Exemplarily, the inventive logic element has three input terminals, possibly with two of the terminals electrically connected. Disclosed is also an article that comprises a single logic element having two input terminals and providing a logic function (XNOR) that previously could only be provided by a combination of logic elements.

In a particular aspect, the invention is a novel semiconductor RST device. The device comprises three semiconductor regions which are spatially sequential in a first direction. The regions are designated, in sequence, as channel or emitter region, barrier region, and collector region. The barrier region has a composition that is adapted to forming a potential barrier between the emitter and the collector. The device also comprises first, second, and third spaced apart electrical contacts to the emitter, with neither of said first, second and third contacts making electrical contact to the collector. The device furthermore comprises an electrical contact to the collector that does not make electrical contact to the emitter region. The charge carriers injected into the collector from the emitter can be hot electrons or hot holes, with the former typically being preferred.

At least in currently preferred embodiments of the novel RST device the geometry is such that, for a given voltage $V_{sd}$, the current into (or out of, as the case may be) the collector contact (the current to be termed $I_c$) is substantially the same for all electrical states of a given general electrical state of the device. In order words, in these preferred embodiments the contacts are arranged such that $I_c$ is substantially the same, regardless to which pair of input contacts a given voltage $V_{sd}$ is applied, and regardless to which member of the pair of contacts to remaining input contact is connected. $I_c$ in a particular electrical state is "substantially the same" as $I_c$ in another electrical state (both states belonging to the same general electrical state) if the currents differ by at most 25%.

In a further particular embodiment the invention is an article that comprises a multiplicity of logic elements, including at least one element according to the invention. A given logic element comprises a multiplicity of terminals including at least two input terminals and an output terminal. The output terminal of at least one of the logic elements is conneced to an input terminal of at least one of the other logic elements. Associated with each logic element is a logic function (e.g., logic AND, logic OR, etc.). Connected to one of the input terminals (to be referred to as the "control" terminal) of the at least one element according to the invention (this logic element will be referred to as a "re-programmable" element) are electrical means adapted for applying an eletrical signal corresponding to logic 0 or to logic 1 to the "control" terminal. In other words, said electrical means are adapted for changing the electrical state of the re-programmable element, by causing the "control" terminal to be either at logic 0 or at logic 1. Exemplarily, the electrical means are the output terminal of another logic element, or they are an external signal source. Significantly, the re-programmable element performs a first logic function if the "control" terminal is at logic 0, and a second logic function if it is at logic 1. A logic circuit containing a re-programmable logic unit that can be switched by external electrical means will be referred to as a "re-programmable" logic circuit. A logic circuit that contains a re-programmable logic element that can be switched by internal electrical means, e.g., by application to the "control" terminal of a voltage that is derived from, or controlled by, the output of another of the logic elements, will be referred to as a "self-organizing" logic circuit.

DETAILED DESCRIPTION OF SOME EXEMPLARY EMBODIMENTS OF THE INVENTION

Figure 1:
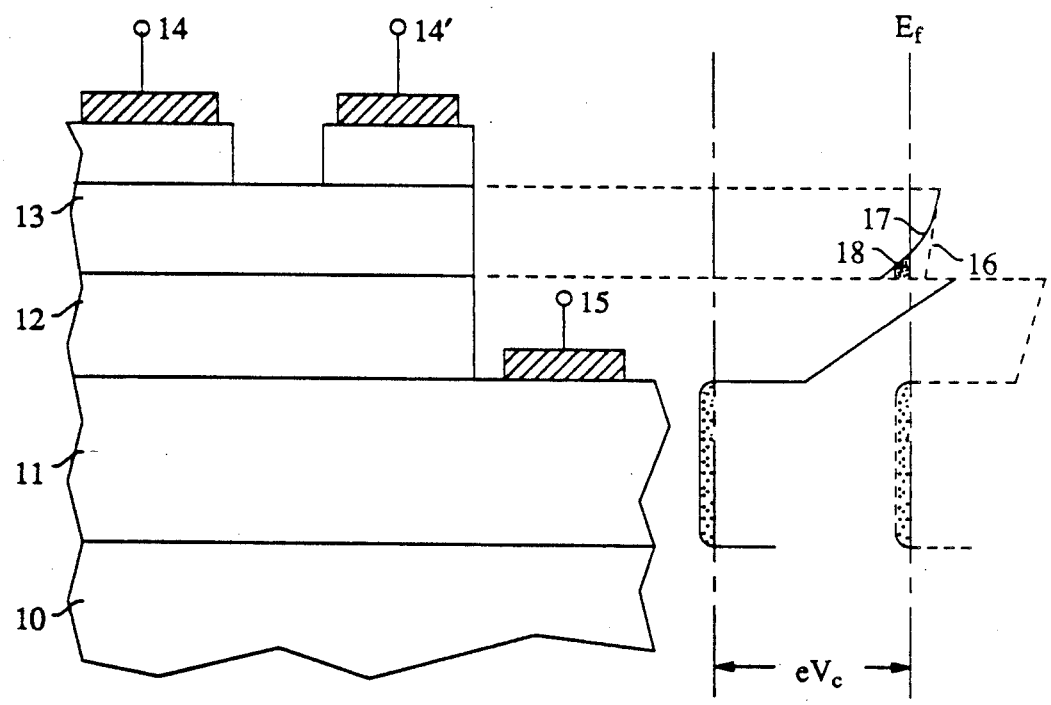
FIG. 1 schematically depicts a prior art RST device.

FIG. 1 schematically depicts relevant features of a prior art RST device and the associated energy band diagram. Reference numeral 10 refers to the semi-insulating substrate (e.g., InP), 11 to the collector region (e.g., about 500 nm $n^{30}$ InGaAs), 12 to the barrier region (e.g., 200 nm undoped InAlAs), and 13 to the emitter region, (e.g., 50 nm InGaAs, $10^{16} cm^{-3} Si$). Numbers 14 and 14' refer to the two "channel" contacts, and 15 to the collector contact. In the energy band diagram of FIG. 1, numeral 16 refers to the conduction band edge for $V_c=0$ ($V_c$ is the voltage applied to contact 15), and 17 to the conduction band edge for $V_c > V_T$, where $V_T$ is a threshold voltage associated with the device, defined by the condition that, if 13 is essentially undoped, essentially no free electrons are in the channel if $V_c > V_T$, but free electrons are induced into the channel by a positive $V_c > V_T$. Numeral 18 refers to these electrons, and $E_F$ indicates the Fermi energy. In principle $V_T$ need not be a positive voltage. For instance, the barrier layer may have one or more modulation doped donor layers, so as to induce a "normally-on" channel.

Figure 2:
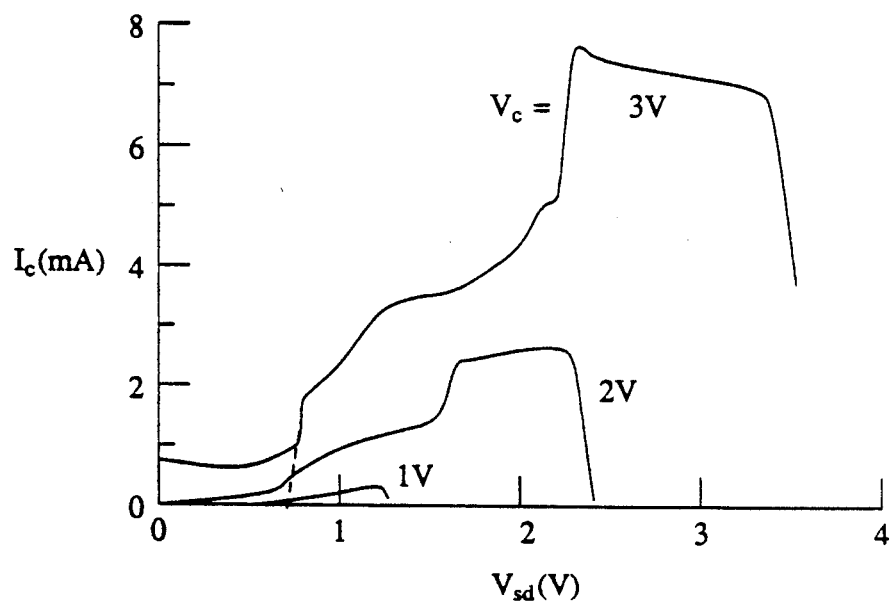
FIG. 2 shows an exemplary electrical characteristic of a prior art RST device.

FIG. 2 shows an exemplary plot of $I_c$ versus $V_{sd}$ for a transistor according to FIG. 1, wherein $I_c$ is the current into contact 15 and $V_{sd}$ is the voltage applied between channel contacts 14 and 14'. Further details of the above referred to device will be discussed in Example 1.

Next we will describe an exemplary RST device according to the invention. The novel device comprises at least three contacts to the emitter, and thus clearly differs structurally from prior art RST devices. For the sake of definiteness the discussion herein will be primarily in terms of a device with three emitter contacts. Inventive devices exemplarily have a layer structure substantially as shown in FIG. 1, but differ, inter alia, with regard to number and arrangement of emitter contacts.

Figure 3:
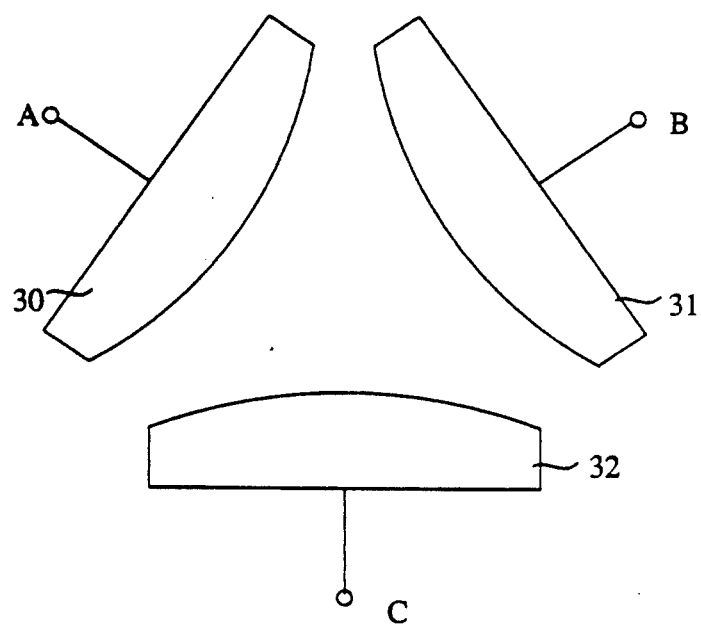
FIG. 3 schematically depicts, in plane view, the arrangement of contact means associated with an exemplary device according to the invention.

FIG. 3 schematically shows in plane view an exemplary emitter contact arrangement, wherein regions 30, 31, and 32 indicate the emitter contacts (the channel is not shown). Identifying contacts 30, 31, and 32 with terminals A, B, and C, respectively, and the collector contact of the inventive RST device with "output" (the latter contact corresponds to 15 of FIG. 1 but is not shown in FIG. 3), the device characteristics correspond to the truth table shown in Table 1. The collector voltage is applied not directly to the collector layer but through an appropriate resistive load, which may comprise a resistor or, preferably, a depletion-mode transistor, as is well known to those skilled in the art. The value of this resistive load typically will be low compared to the resistance of the barrier in the absence of an appropriate applied voltage $V_{sd}$, and high compared to the resistance of the source-to-collector path over the barrier when an appropriate $V_{sd}$ is applied, resulting in "heating" of the channel electrons and induction of the RST. Consequently, the electric potential of the collector layer will be high (logic level 1) in the absence of RST and low (logic level 0) in the presence of RST.

Figure 10:
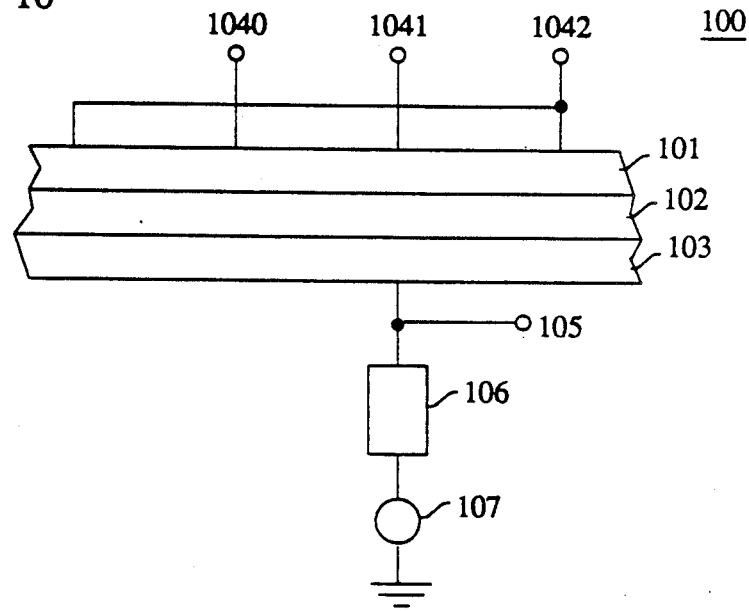
FIG. 10 depicts an exemplary combination of a device according to the invention which resistive means and a source of voltage.

FIG. 10 depicts schematically in combination an exemplary RST device according to the invention, together with resistive means and a source of electrical power. The combination 100 is an embodiment of the inventive logic element, with numerals 101, 102, and 103 referring, respectively to emitter, barrier, and collector of the RST device, numerals 1040, 1041 and 1042 referring to the input terminals, and numerals 105, 106 and 107 referring to the output terminals, load resistor, and voltage source, respectively.

TABLE 1

| A | B | C | out |
|---|---|---|-----|
| 1 | 1 | 1 | 1 |
| 0 | 1 | 1 | 0 |
| 1 | 0 | 1 | 0 |
| 0 | 0 | 1 | 0 |
| 1 | 1 | 0 | 0 |
| 0 | 1 | 0 | 0 |
| 1 | 0 | 0 | 0 |
| 0 | 0 | 0 | 1 |

It will be noted that for terminal C fixed at logic 1 the device functions as a logic AND unit, and for C fixed at logic 0 is functions as a logic NOR unit. As is well known, any binary logic can be implemented with either of these two logic functions, combined with a NOT element. The NOT element or inverter is trivially obtained by setting both B and C to 0, then out=NOT (A). Of course, implementation of an inverter does not require three electrodes and the NOT function can, for instance, be obtained directly from the basic CHINT device in FIG. 1.

Figure 5:
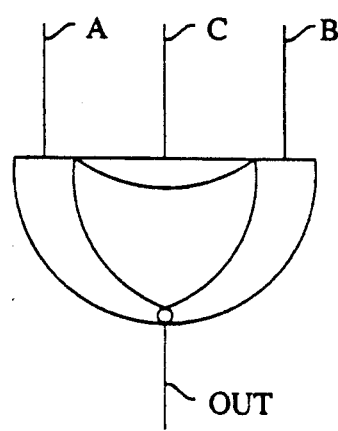
FIG. 5 shows the proposed circuit symbol for the inventive logic element (NORAND)

As those skilled in the art will recognize, the above truth table is unlike that of any previously known logic element, and could previously only be obtained by a combination of two or more prior art logic elements. A device according to the invention thus can form a novel logic element. We are proposing to refer to the novel element as "NORAND", and are also proposing the circuit synbol shown in FIG. 5 for a NORAND element.

Figure 8:
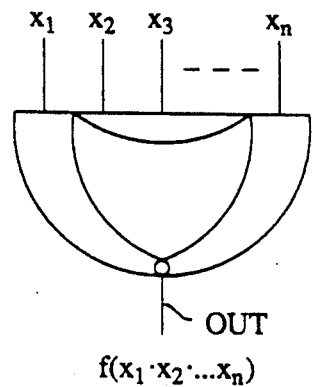
FIG. 8 symbolically represents the action of a general NORAND logic element.

The above described three input NORAND element is a particular example of the novel, more general NORAND logic element, schematically shown in FIG. 8, which has n input terminals (n is an integer $\geq 2$) and one output terminal, with $X_1, X_2, \ldots X_n$ signifying the n boolean inputs (having values of either 0 or 1), and $f(X_1, X_2 \ldots X_n)$ being the boolean output (having value of 0 or 1) depending on the inputs $X_1, X_2 \ldots X_n$.

The logic function provided by the general NORAND logic element can be defined as follows:

$$f(X_1,X_2,\ldots X_n) \triangleq X_1 \cdot X_2 \ldots X_n + \overline{X}_1 \cdot \overline{X}_2 \ldots \overline{X}_n,$$

wherein the first term in the right hand side represents the logical AND of all the inputs, the second term represents the logical AND of the inverses of all of the inputs, and "+" signifies logic OR.

Figure 9:
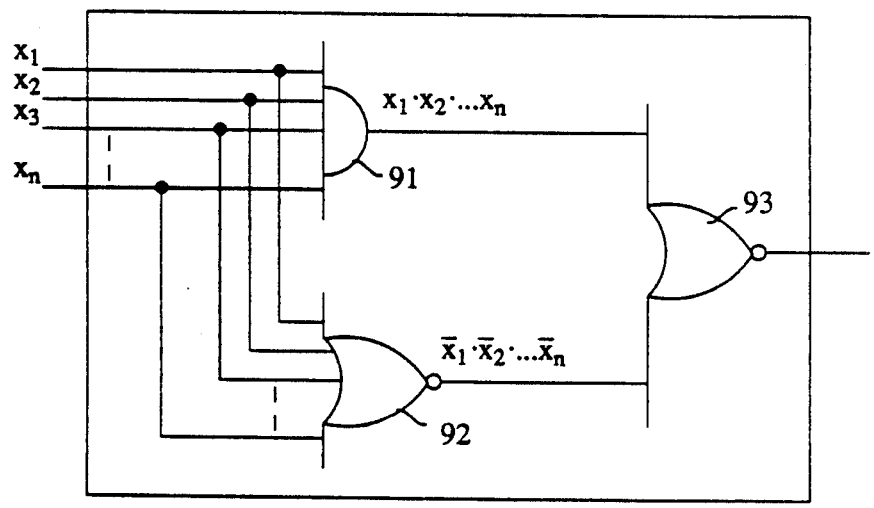
FIG. 9 exemplifies the logic function carried out by a general NORAND element.

As those skilled in the art will recognize, the above definition can be implemented as is symbolically depicted in FIG. 9, wherein logic element 91 is an n-input AND element, logic element 92 is an n-input NOR element, and logic element 93 is a 2-input OR element. As is evident from FIG. 9, the "prior art" implementation of the NORAND function involves three logic elements with the signals experiencing 2 gate delays. On the other hand, a NORAND element according to the invention is a single logic element. Furthermore, prior art logic elements (including AND, NOR and OR) typically require more than one active device, whereas the inventive NORAND element can be implemented with a single active device. Thus, logic circuits that include logic elements according to the invention can involve fewer gate delays and requires less area than equivalent prior art circuits.

Exemplarily, a two-terminal NORAND element [or, equivalently, a n-terminal (n>2) NORAND in which all input terminals except one are tied together electrically] is an XNOR logic element and may be advantageously used, for instance, in a binary adder. Applying the above definition of the general NORAND element to the case n=2 results in the following:

$$f(X_1, X_2) = X_1 \cdot X_2 + \overline{X}_1 \cdot \overline{X}_2 = \overline{X_1 \oplus X_2},$$

where $\oplus$ signifies EXCLUSIVE-OR. Implementing the XNOR logic function with conventional devices typically involves 3 gates, resulting in 2 gate delays. Thus, conventional implementation of XNOR is relatively inefficient, whereas it can be implemented very simply and efficiently with a device according to the invention.

It should be noted that, even though the two-terminal NORAND element is a two-terminal XNOR element, the n-terminal (n>2) NORAND element is not equivalent to an n-terminal XNOR element. All logic elements according to the invention have the property that their output is logic 1 only if all inputs are at the same logic state (1 or 0), and is zero whenever all inputs are not at the same logic state.

Although the at least three input terminals of a NORAND element are logically identical, we believe that frequently one of the terminals will be used as a control terminal, whereas the remaining terminals will be used as logic input terminals.

A single three-terminal device according to the invention can implement either logic AND or logic NOR, depending on the bias applied to one of the three channel contacts (in the above described case termed the "control" terminal). This not only has the advantage that it can greatly simplify the design of complex logic and greatly reduce the number of gate delays associated with any given logic process, but it also permits simple re-configuration of a logic circuit, either through deliberate re-biasing of the control terminal of one or more logic units of the circuit, or through internal action of the circuit itself.

Figure 6:
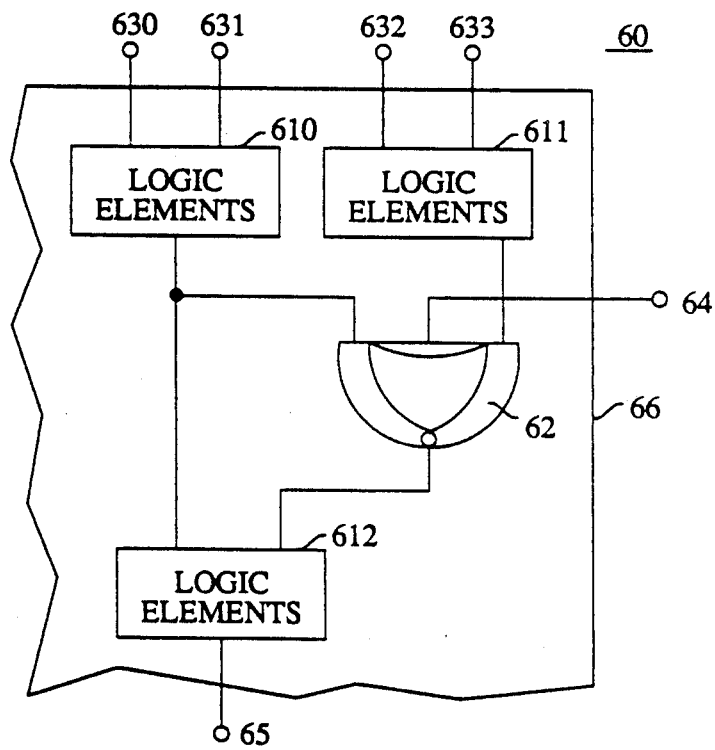
FIGS. 6 and 7 schematically depict relevant portions of, respectively, a re-programmable logic circuit and a self-organizing logic circuit.

FIG. 6 schematically depicts a portion of an exemplary article 60 according to the invention, wherein 66 refers to appropriate supporting means, 610, 611, and 612 to logic elements (or combination of elements, possibly consisting completely or in part of devices according to the invention), 62 to a NORAND element, 630, 631, 632, 633 to logic input terminals, 64 to the control terminal of the NORAND element, and 65 to an output terminal. It will be appreciated that FIG. 6 is meant to be representative of all possible re-programmable logic circuits.

Figure 7:
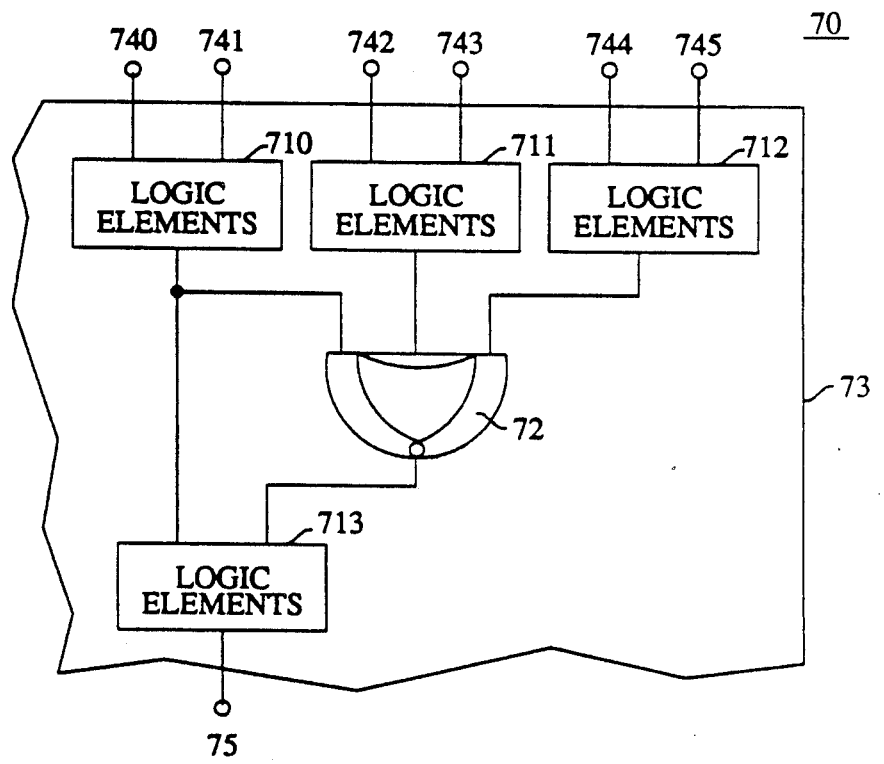

FIG. 7 schematically depicts a portion of a further exemplary article 70 according to the invention. Numeral 73 refers to appropriate supporting means (e.g., circuit board), numerals 710, 711, 712, and 713 to logic elements (or combination of elements, possibly consisting completely or in part of devices according to the invention), numerals 740, 741, . . . to logic input terminals, numeral 72 to a NORAND element, and numeral 75 to an output terminal. Again, FIG. 7 is intended to be representative of all possible self-organizing logic circuits.

As those skilled in the art will appreciate, it is of course possible to design logic circuits that are both re-programmable and self-organizing, and such circuits are also contemplated.

Figure 4:
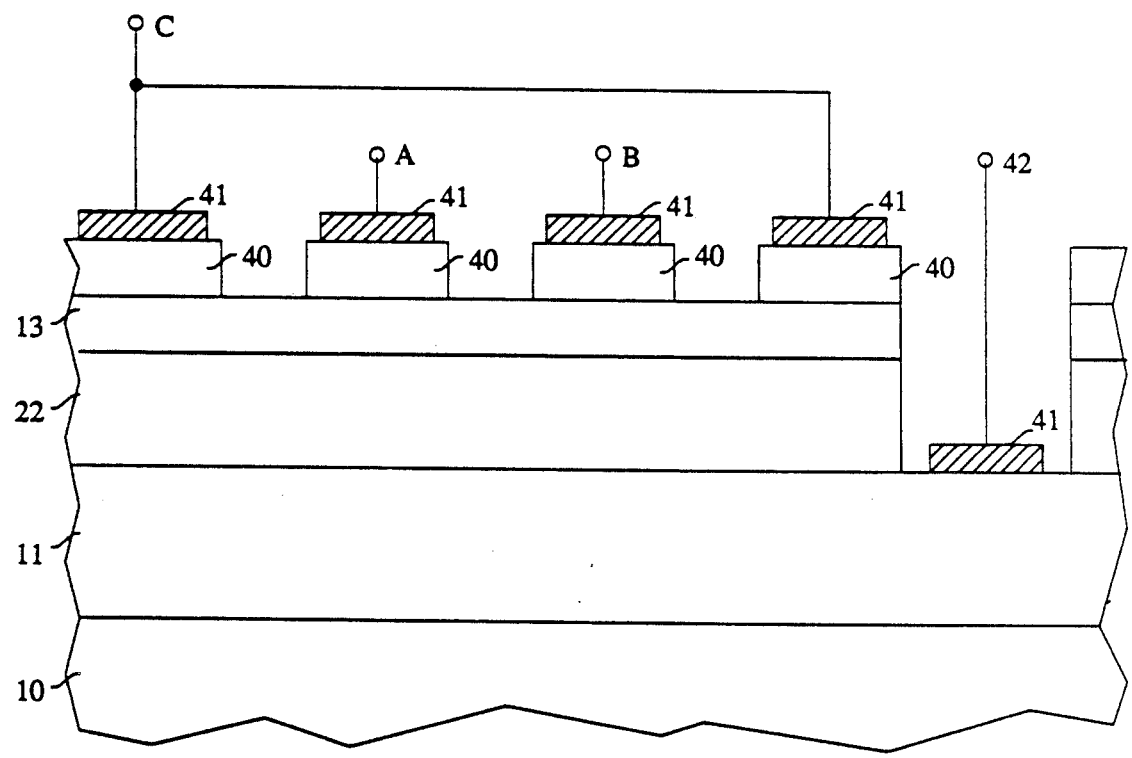
FIG. 4 shows schematically a further exemplary device according to the invention.

Devices according to the invention need not comprise an electrode arrangement of the type shown in FIG. 3, and FIG. 4 schematically depicts a further, and currently preferred, exemplary contact arrangement. On substrate 10 is collector 11, thereon is barrier layer 22, which is followed by channel region (emitter) 13. Numeral 40 refers to a conducting semiconductor cap layer, and 41 to appropriate contacts. Terminal 42 is the output terminal, terminals A and B are, exemplarily, the input terminals, and terminal C is the control terminal. It should be noted that the control terminal does not have to be the split outside terminal.

Devices according to the invention can be embodied in a variety of materials system, including the GaAs/AlGaAs and InGaAs/InAlAs systems. RST devices, based not on hot electrons but on hot holes, have been embodied in the $Ge_{1-x}Si_x$/Si system, and this system can also be used for devices according to the invention.

Currently we consider the InGaAs/InAlAs system, lattice matched to InP, to be particularly advantageous because, due to certain features of its electronic structure, devices embodied in this material system can have high peak-to-valley ratio (of the $I_d$ versus $V_{sd}$ characteristic), low leakage current, and high speed. Among the features are a relatively large conduction band discontinuity ($\Delta E_c$), relatively low electron mass in InGaAs, and $\Delta E_{\Gamma L}$ in InGaAs that is substantially greater than $\Delta E_c$ ($\Delta E_{\Gamma L}$ is the energy separation between the $\Gamma$ valley an the L valleys) in the conduction band of InGaAs.

EXAMPLE 1

On a semi-insulating Fe-doped InP (100) substrate was grown by conventional MBE at 500° C. the following sequence of epitaxial semiconductor layers: a 500 nm $In_{0.53}Ga_{0.47}As$ collector layer, doped with a donor (Si) concentration of $10^{19}$ cm$^{-3}$; a 200 nm undoped $In_{0.52}Al_{0.48}As$ barrier layer; a 50 nm $In_{0.53}Ga_{0.47}As$ channel layer, lightly doped with Si($1\times10^{16}$ cm$^{-3}$); and a 30 nm $In_{0.53}Ga_{0.47}As$ cap layer, Si dopant concentration $1\times10^{20}$ cm$^{-3}$.

Three terminal (CHINT/NERFET) devices were then defined by conventional semiconductor manufacturing techniques that included photolithography, and etching in $H_3PO_4$: $H_2O_2$: $H_2O$. These processing steps involved formation of a "trench" through the cap layer to define the source and drain areas, and of a deep trench to the collector, analogous to what is shown in FIG. 4. The former trench width was chosen to vary from 0.6 to 1.2 $\mu$m for different devices, and the emitter width to vary from 25 to 75 $\mu$m. After etching of the trench, the exposed portion of the channel region is depleted of mobile charge carriers by the surface potential. Therefore, the conductivity of this layer relies on a positive voltage applied to the collector, which induces an inversion layer.

Subsequent to etching of the trenches metal contacts (Au-Ge) were formed on the cap layer and on the exposed collector region, resulting in non-alloyed ohmic contacts to the channel and the collector at room temperature and at temperatures as low as liquid He temperature. The electrical characteristics of many of the thus produced devices were determined by conventional procedures. A particular one of these devices had the $I_c$ versus $I_{sd}$ curve shown in FIG. 2.

EXAMPLE 2

A multilayer semiconductor structure identical to the structure of Example 1 was produced by a method essentially as described in Example 1. By conventional techniques the structure is patterned so as to define a multiplicity of devices of the type shown in FIG. 4. In a given device the trenches between cap layer regions are about 1 $\mu$m wide and about 50 $\mu$m long. Means are provided for electrically contacting the two terminals A and B, the two members of the terminal C and the output terminal. After connecting an appropriate voltage source to the output terminal through a depletion mode transistor, the device is tested and is found to perform in accordance with Table 1. The switching time is found to be less than 1 microsecond.

What is claimed is:

1. An article comprising an electronic logic element comprising input terminals and an output terminal, associated with each input terminal and the output terminal being a first and a second electrical condition (to be termed logic 0 and logic 1, respectively), CHARACTERIZED IN THAT the logic element comprises at least two input terminals and is a logic element other than a NOT element, wherein the logic element contains a single active electronic device.

2. The article of claim 1, wherein the output terminal is at logic 1 if all input terminals are at logic 1, or if all input terminals are at logic 0, and the output terminal is at logic 0 for all other combinations of logic 1 and logic 0 of the input terminals.

3. The article of claim 2, wherein the logic element has three input terminals.

4. The article of claim 1, further comprising means responsive to the electrical condition of the output terminal of said logic element.

5. An article comprising a multiplicity of electronic logic elements, each logic element comprising a multiplicity of terminals including two input and one output terminal, the output terminal of at least one of the logic elements connected to an input terminal of at least one of the other logic elements, associated with a given logic element being a logic function; the article further comprising means for providing a signal to at least one input of at least one of said logic elements, and means for providing an output signal;

CHARACTERIZED IN THAT
the article comprises at least one electronic logic element with which are associated at least a first and a second logic function, said logic element to be referred to as a "re-programmable" logic element, the re-programmable logic element being switchable between states associated, respectively, with the first and second logic functions by electrical means connected to a terminal of the re-programmable logic element.

6. The article of claim 5, wherein the re-programmable logic element comprises three input terminals, and said electrical means are connected to one of the three input terminals.

7. The article of claim 5, wherein said electrical means comprise one or more of the logic elements other than the re-programmable logic element, such that the logic function that is to be executed by the re-programmable logic element is determined by said one or more of the multiplicity of logic elements.

8. The article of claim 5, further comprising means responsive to the output signal.

9. A semiconductor device comprising
(a) three semiconductor regions which are spatially sequential in a first direction and which are designated, in sequence, emitter region, barrier region, and collector region, the barrier region having a composition adapted to forming a potential barrier between the emitter region and the collector region;
(b) first and second spaced apart electrical contacts to the emitter region that do not make electrical contact to the collector layer region; and
(c) an electrical contact to the collector region; CHARACTERIZED IN THAT the device comprises (d) at least a third electrical contact to the emitter region, the third contact being spaced apart from the first and second contacts and not making electrical contact to the collector region;

10. The device of claim 9, wherein associated with the device is a current $I_{sub}$ into, or out of, the collector region contact, and wherein the first, second and third contacts are arranged such that $I_{sub}$ is substantially the same, regardless to which two of the first, second and third contacts a given voltage $V_{sd}$ is applied, and regardless to which member of said two of the first, second and third contacts the remaining contact is connected.

* * * * *